US011743851B2

(12) United States Patent
Ghannouchi et al.

(10) Patent No.: US 11,743,851 B2
(45) Date of Patent: *Aug. 29, 2023

(54) SYSTEM AND METHOD FOR ENHANCED TRANSMITTER EFFICIENCY

(71) Applicant: Fadhel M Ghannouchi

(72) Inventors: Fadhel M. Ghannouchi, Calgary (CA); Mehdi Vejdaniamiri, Calgary (CA); Mohamed Helaoui, Calgary (CA)

(*) Notice: Subject to any disclaimer, the term of this patent is extended or adjusted under 35 U.S.C. 154(b) by 0 days.

This patent is subject to a terminal disclaimer.

(21) Appl. No.: 16/933,103

(22) Filed: Jul. 20, 2020

(65) Prior Publication Data
US 2020/0351808 A1 Nov. 5, 2020

Related U.S. Application Data

(63) Continuation-in-part of application No. 16/429,302, filed on Jun. 3, 2019, now Pat. No. 10,721,702, which
(Continued)

(51) Int. Cl.
| H04L 27/26 | (2006.01) |
| H04W 56/00 | (2009.01) |
| H04B 1/04 | (2006.01) |
| H04L 27/08 | (2006.01) |
| H04L 27/36 | (2006.01) |
| H03F 1/02 | (2006.01) |
| H03F 3/24 | (2006.01) |
| H04L 25/03 | (2006.01) |

(Continued)

(52) U.S. Cl.
CPC .......... *H04W 56/0035* (2013.01); *H03F 1/02* (2013.01); *H03F 3/24* (2013.01); *H04B 1/04* (2013.01); *H04L 25/03012* (2013.01); *H04L 25/03343* (2013.01); *H04L 27/08* (2013.01); *H04L 27/2647* (2013.01); *H04L 27/368* (2013.01); *H04B 2001/045* (2013.01); *H04B 2001/0408* (2013.01); *H04W 74/004* (2013.01); *H04W 74/006* (2013.01); *H04W 88/02* (2013.01); *H04W 88/08* (2013.01)

(58) Field of Classification Search
CPC ........... H04W 56/0035; H04W 74/004; H04W 74/006; H04W 88/02; H04W 88/08; H03F 1/02; H03F 3/24; H04B 1/04; H04B 2001/0408; H04B 2001/045; H04L 25/03012; H04L 25/03343; H04L 27/08; H04L 27/2647; H04L 27/368
See application file for complete search history.

(56) References Cited

U.S. PATENT DOCUMENTS

| 7,127,176 B2* | 10/2006 | Sasaki | H04B 10/25758 398/115 |
| 7,383,493 B2* | 6/2008 | Shen | G11B 20/1833 714/801 |

(Continued)

*Primary Examiner* — Vineeta S Panwalkar

(57) ABSTRACT

A method for distortion compensation in a transmission link comprising obtaining information of an amplitude distribution of a signal prior to being transmitted by a transmitter, receiving the transmitted signal at a receiver and determining a received signal amplitude distribution, comparing the received signal amplitude distribution to the amplitude distribution of the signal prior to transmission and using results of the comparison to estimate the AM/AM non-linearity in the transmitter.

8 Claims, 11 Drawing Sheets

Related U.S. Application Data is a continuation of application No. 15/283,888, filed on Oct. 3, 2016, now Pat. No. 10,313,996, which is a continuation of application No. 14/631,375, filed on Feb. 25, 2015, now Pat. No. 9,461,675.

(60) Provisional application No. 61/944,167, filed on Feb. 25, 2014.

(51) Int. Cl.
*H04W 74/00* (2009.01)
*H04W 88/02* (2009.01)
*H04W 88/08* (2009.01)

(56) References Cited

U.S. PATENT DOCUMENTS

| | | | |
|---|---|---|---|
| 8,385,391 B2* | 2/2013 | Balasubramanian | H04L 25/03343 375/219 |
| 9,461,675 B2* | 10/2016 | Ghannouchi | H04L 27/368 |
| 2007/0241812 A1* | 10/2007 | Yang | H03F 3/21 330/75 |
| 2009/0232191 A1* | 9/2009 | Gupta | H04B 10/25752 375/216 |
| 2016/0087820 A1* | 3/2016 | Sahin | H04L 25/03904 375/240 |
| 2017/0093495 A1* | 3/2017 | Lozhkin | H04B 10/25753 |

* cited by examiner

BER versus SNR for the proposed method for LUT-based PA with no compensation (dashed blue), the conventional DPD (red circle), the proposed method (green diamond) and phase-only DPD (blue line)

SYSTEM AND METHOD FOR ENHANCED TRANSMITTER EFFICIENCY

CROSS REFERENCE TO RELATED APPLICATIONS

This application is a Continuation-in Part of U.S. application Ser. No. 16/429,302 filed Jun. 3, 2019, which is a Continuation of U.S. application Ser. No. 15/283,888, filed Oct. 3, 2016 which is a Continuation of U.S. Ser. No. 14/631,375, filed Feb. 25, 2015, now U.S. Pat. No. 9,461,675, which in turn claims the benefit of U.S. Provisional Application No. 61/944,167 filed Feb. 25, 2014, all of which are incorporated herein by reference.

FIELD OF THE DISCLOSURE

The present disclosure relates to linearization in a wireless radio link, and particularly to a system and method for nonlinearity compensation in a transmitter.

BACKGROUND

The quality of a signal in a communication system is affected by the amount of distortions introduced by the system during transmission. In a transmitter, and in particular, a power amplifier (PA) is one of the main sources of nonlinear distortions in the wireless radio transmission link. A plot of the output power of a PA as a function of input power is called the amplifiers compression curve 102, shown generally in FIG. 1. As input power increases and the output power of the amplifier is driven closer to its maximum level, this relationship becomes non-linear. This non-linear region 104 is usually referred to as the compression region where equal increments of input power result in smaller increments of output power. The gain 106 of the amplifier drops off in this region. Unfortunately, in order to maintain high power efficiency, the PA must usually be operated in the compression region, which introduces considerable distortions to the signal.

The power spectral density of a transmitter's output is sometimes referred to as the spectral emission. Nonlinear amplification of a signal may cause the signal to spread in the frequency domain into adjacent frequency bands resulting in so-called extraneous emissions. Most communications standards set a limit on the spectral emissions of a transmitter. The shape of the spectral emission of the transmitter i.e. the emitted power density as a function of frequency is determined by the specific type of signal modulation, as well as a statistical distribution of a baseband digital bit sequence. Given this information the shape of the spectral emission can be determined for an ideal system. However system non-idealities skew this shape. The PA non-linearity is one of the major sources of this non-ideality, which often tends to widen the bandwidth of the transmitted signal and raise the power density level in the frequency regions neighboring the transmission channel (spectral regrowth). A spectral mask is defined by standards (such as those by the 3rd Generation Partnership Project (3GPP)) which sets a limit on the spreading of the power density spectrum as well as extraneous emissions such as harmonics of the carrier frequency or any unwanted spurious signals generated by the amplifier.

A PA's nonlinearity is sometimes evaluated using a metric called the adjacent channel power ratio (ACPR). The ACPR is defined as the ratio of total power within a certain bandwidth separate from the transmission channel, usually coinciding with the channel adjacent to the transmission channel to the total power within the transmission bandwidth.

In order to obtain an acceptable Bit Error Rate (BER) at the receiver end, linearization techniques may be used to compensate for these distortions while maintaining high power efficiency. Among the various methods for compensation, commonly used linearization techniques include digital predistortion (DPD) and post-compensation at the receiver side. Without linearization, power back-off at the transmitter is required to obtain an acceptable BER, assuming that the channel is well equalized at the receiver side and that the receiver is fully linear.

Pre-distortion is basically a method by which one first stimulates a non-linear PA with baseband samples and then observes the result of that stimulus at the PA output. Then, the amplitude-to-amplitude modulation (AM/AM) and amplitude-to-phase modulation (AM/PM) effects of the PA are estimated. These estimated distortions are then removed from the PA by pre-distorting the input stimulus with their inverse equivalents. In other words DPD consists of applying an inverse function having a gain with an inverse amplitude and phase behavior of the complex gain behavior of the PA to the signal before sending it to the power amplifier. The cascaded pre-distortion function and the PA have a combined gain that is linear particularly in the compression region. In order to compensate for the complex gain distortion of the PA close to saturation, the amplitude and phase are expanded relative to the original input signal which causes an increase in the signal peak-to-average power ratio (PAPR). Since the maximum power of the input signal is limited by the PA saturation, an increase in the PAPR forces a decrease in the mean input power (typically 2-4 dB). This power back off results in decreased drain efficiency of the PA transistor(s). On the other hand, DPD performance is considerably affected by impairments in up and down-conversion circuits (such as feedback path components for example mixers, filters, quadrature modulator and demodulator). These impairments affect estimation of the inverse function of the PA behavior.

Other techniques for DPD use training sequences to characterize the PA nonlinearity. In this approach, a training sequence is padded in each frame and is sent to the receiver. At first, the effect of the channel is equalized. The resulting signal is then considered as the replica of the signal at the output of the PA. Based on the training sequence, which is known at the receiver side, the PA nonlinearity is extracted. The model is then sent to the transmitter for compensation.

SUMMARY

Prior predistortion techniques suffer from efficiency degradation, since the signal predistortion takes place at the transmitter side before the power amplifier, which results in an increase in the peak-to-average power ratio of the signal. An embodiment of the present disclosure provides a linearization method and system that compensates for the transmitter nonlinearity at the receiver side in order to achieve high power efficiency in the power amplifier. In other words the linearization method and system of the present disclosure allows a transmitter PA to be operated closer to the compression region, to provide better power efficiency.

According to an embodiment of the present disclosure the linearization method and system provides for a cumulative distribution function (CDF) based algorithm to be used to estimate the PA's AM/AM nonlinearity at a receiver side of a wireless radio link.

According to a further embodiment the present disclosure, the linearization system and method may be combined with transmitter-phase predistortion along with the receiver-CDF-based amplitude post-compensation for improving overall efficiency and BER performance of the wireless radio link.

In accordance with an embodiment of the present matter there is provided a method for distortion compensation in a transmission comprising:

obtaining information of an amplitude distribution of a signal prior to being transmitted by a transmitter;

receiving the transmitted signal at a receiver and determining a received signal amplitude distribution;

comparing the received signal amplitude distribution to the amplitude distribution of the signal prior to transmission; and using results of the comparison to estimate the AM/AM non-linearity in the transmitter.

In accordance with a further aspect the method further includes applying phase compensation predistortion to the signal before amplification by an amplifier in the transmitter.

In accordance with a still further aspect of the method there is further included using the estimate of the AM/AM non-linearity to derive a compensated signal.

In accordance with a still further aspect of the method there is further included applying a channel equalization prior to comparing the amplitude distributions.

BRIEF DESCRIPTION OF THE DRAWINGS

The present disclosure will be better understood with reference to the drawings, in which.

DETAILED DESCRIPTION OF THE DRAWINGS

Figure 1:
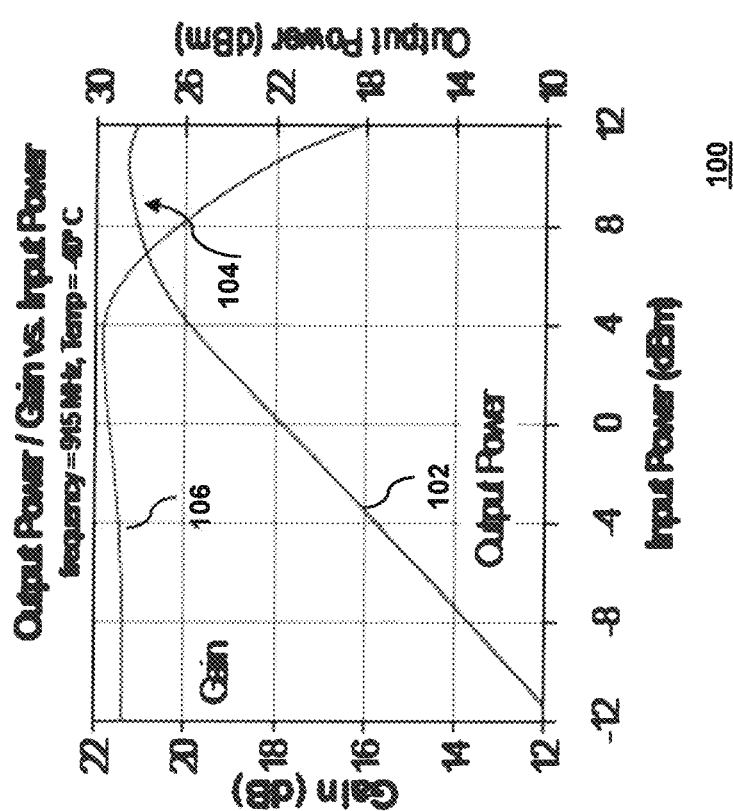
FIG. 1 is plot of compression and gain curves for an amplifier.

The present disclosure describes a partition of distortion mitigation technique at both the transmitter and the receiver sides of the radio link. The method compensates for the phase nonlinearity at the transmitter side using phase digital predistortion (DPD) and mitigates the amplitude nonlinearity at the receiver side by analyzing the cumulative density function (CDF) of the received signal. The technique results in more power efficient transmitter if less stringent linearity requirements are tolerable. The channel effects have been also considered and are equalized before the amplitude nonlinearity compensation in the receiver. The performance of the distributed distortion compensation technique is compared, in terms of Error Vector Magnitude (EVM), Adjacent Channel Power Ratio (ACPR) and Power Efficiency (PE). Measurement results show that the proposed partitioning distortion mitigation approach provides an EVM of 1.2% and 1.7% for WiMAX and LTE signals respectively, compared to 1.3% and 1.7% for the conventional power back off (PBO) technique and 0.8% and 0.6% for the complex Digital Predistortion (DPD). Meanwhile the PE significantly improves from 5.6% and 14% for the conventional power back-off technique (PBO) to 10.8% and 19.2% using the proposed method. The BER values at the receiver were then compared for the present method, the DPD and Phase-only DPD methods.

In systems using non-constant envelope modulations such as WCDMA (wideband code division multiple access), LTE (Long Term Evolution) and WiMAX (Worldwide Interoperability for Microwave Access), mobile handset PAs are usually designed for quasi-linear operation. In other words, they are designed to be linear at specific back-off power from a peak power.

To transmit the high PAPR signals with acceptable distortion, PAs are usually biased at class A or class AB. Furthermore, a large back-off from the peak power is applied for the PA to work linearly. This large back-off causes a decrease in the power efficiency and hence increases the heat dissipation.

In DPD, the amplitude causes an increase in the PAPR and therefore power efficiency degradation. However, phase nonlinearity compensation by itself does not affect the PAPR, and therefore does not degrade the efficiency of a mobile handset.

In OFDM (orthogonal frequency division multiplexing) for example, by knowing the amplitude distribution function (DF) of the original OFDM signal (i.e. the signal prior to transmission), the amplitude nonlinearity of the PA can be estimated at the receiver side from a comparison between the distribution of the original signal before the PA amplification and the received signal.

Embodiments of the linearization method and system of the present disclosure do not require the use of a training sequence for the distortion estimation purpose.

A method for distortion compensation according to the present disclosure comprises transmitting a signal through a PA after equalizing the channel effects at the receiver side; a baseband-equalized signal is used to estimate the amplitude nonlinear distortion using a cumulative distribution function (CDF) of the received signal amplitude at the receiver. The transmitter amplitude nonlinearity is compensated for in the receiver side. Furthermore, the present method may include pre-distorting a phase nonlinearity at the transmitter. Still further, provided that the transmitted signal has reasonable amplitude nonlinearity, such that the transmitted signal may be expected to satisfy an appropriate spectral mask.

Figure 2:
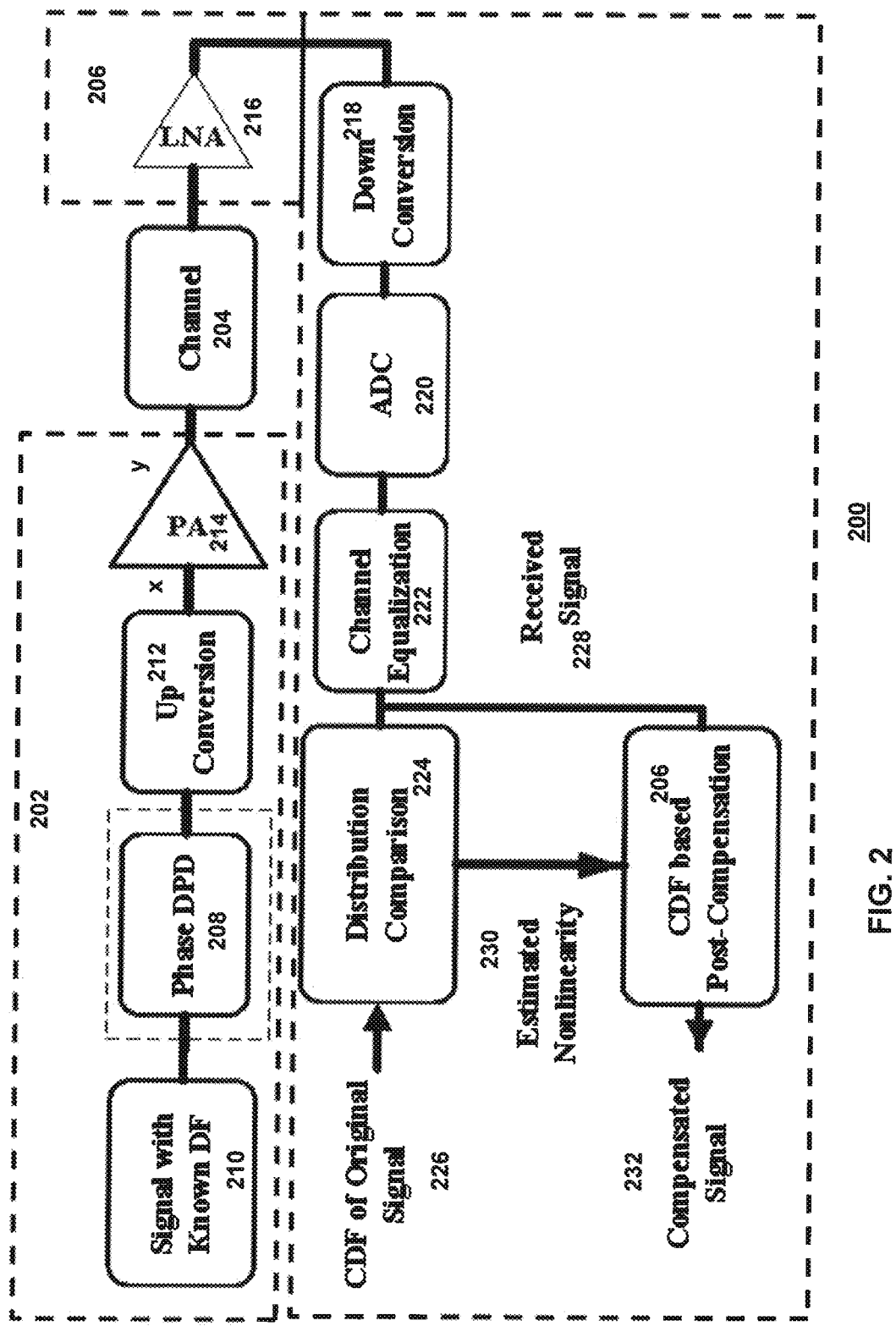
FIG. 2 is a block diagram of radio link (transceiver) components according to an embodiment of the present matter.

A block diagram showing components of a radio link (transceiver) according to an embodiment of the present matter is shown, generally by numeral 200, in FIG. 2. The radio link includes in order, a transmit side 202, a channel 204 and a receive side 206. The transmit side 202 includes a transmitter having an optional phase-only compensation predistortion block (Phase-DPD) 208 to which an RF modulated signal 210 to be transmitted is fed. The input signal 210 has a known distribution function (DF). The output of the phase DPD 208 is passed through an up-converter 212 to a power amplifier 214. The output of the power amplifier drives suitable transmission antenna (not shown) with an amplified signal (or pre-distorted amplified signal if the phase DPD is implemented) which is transmitted along the transmission path or the communications channel 204. The receiver side 206 includes a receive antenna (not shown) for receiving the transmitted signal over the communications channel 204, wherein the antenna is connected to a low noise amplifier (LNA) 216, the output of the LNA 216 is passed through a suitable down-converter 218 and digitizer 220 before being fed to a channel equalization block 222 for equalizing the effects of the channel 204 at the receiver side 206. The equalized signal is passed to a distribution comparison block 224 where a comparison is made between the distribution of the original signal 226 before PA amplification and the received signal 228. This comparison produces an estimate of the amplitude-to-amplitude (AM/AM) nonlinear distortion 230, which may be used in a CDF based post compensation block 232 where the received base-band equalized signal 228 is input and used along with the estimated AM/AM non-linear distortion 230 to output a compensated signal 232. The various blocks in FIG. 2 are described in more detail below. The radio link or communications link in further embodiments may include one or more of optical components, optical links, electrical components, and opto-electronic components to implement a radio over fiber communication link. The opto-electronic components may further include electrical-to-optical conversion, and optical-to-electrical conversion components.

Figure 3:
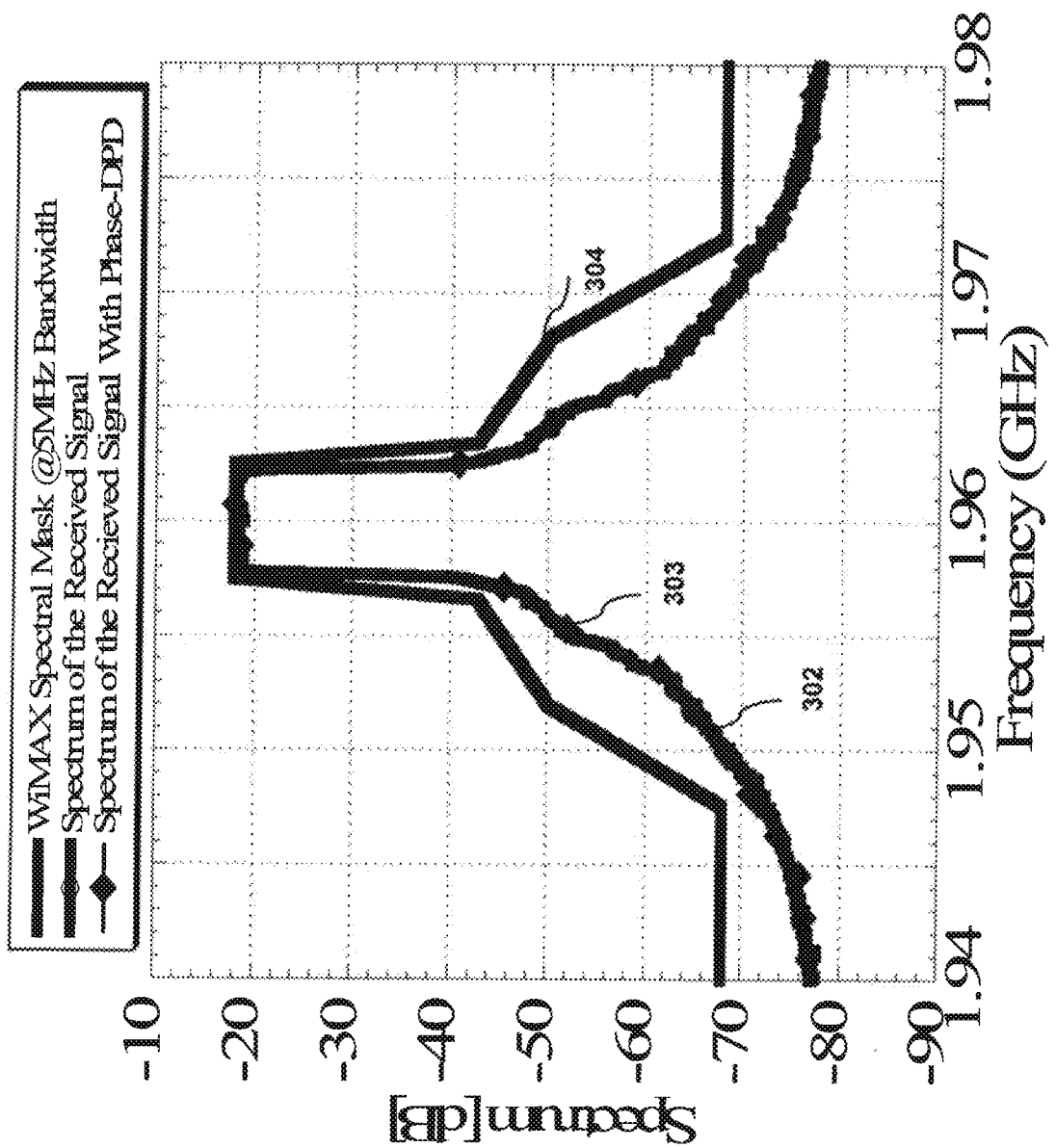
FIG. 3 shows a spectrum of a measured received signal with and without Phase-DPD and a spectral mask according to an embodiment of the present matter.

The spectrum of the measured received signal (228 in FIG. 2) with Phase-DPD applied to the transmitted signal is shown by numeral 302 (the plot with the diamond symbol) in FIG. 3. The spectrum of the measured received signal (228 in FIG. 2) without Phase-DPD applied to the transmitted signal is shown by numeral 303 (the plot with the dot symbol) in FIG. 3. An example spectral mask 304, for WiMAX at a 5 MHz bandwidth is also shown in FIG. 3. It may be seen that in both cases 302 and 303, the received signal spectrum fits within the spectral mask 304.

Referring back to FIG. 2, if x and y denote the complex input and output signals, respectively, of the PA 214 and if $r_x$ and $r_y$ are their corresponding amplitudes, a static power amplifier behavior can be modeled in general as:

$$y = F(r_x) \exp(jG(r_y)) x \qquad (1)$$

where $F(\cdot)$ and $G(\cdot)$ are the AM/AM and the AM/PM nonlinear distortion functions of the PA, respectively. These functions vary with the amplitude of the input signal x.

If the input signal x distribution is known, then by estimating the CDF of the output signal y, the amplitude nonlinearity can be obtained. If $F_1$ denotes the nonlinear function relating the amplitude of the output signal y to the amplitude of the input signal, then:

$$r_y = rF(r) = F_1(r) \qquad (2)$$

where, for simplicity, r is used instead of $r_x$.

If $F_y(\cdot)$ and $F_x(\cdot)$ denote the CDFs of the output signal y and input signal x, respectively, it is known that the following relationship holds between distributions of an output amplitude and an input signal distribution in a system provided that the system transfer function is monotonic:

$$F_y(r_y) = F_x(r) \qquad (3)$$

By Applying the inverse function of $F_1^{-1}$ to both sides of (2) one can write:

$$r = F_1^{-1}(r_y) \qquad (3')$$

By applying the inverse function of $F_x^{-1}$ to both sides of (3) one can write:

$$r = F_x^{-1}[(F_y(r_y)] \qquad (3'')$$

Equating equations (3) and (3') one can write that the inverse of amplitude nonlinearity, $F_1^{-1}(r_y)$ which is the post compensation function, can be estimated as follows:

$$F_1^{-1}(r_y) = F_x^{-1}(F_y(r_y)) = r \qquad (4)$$

From Equation (4), it can be concluded that by knowing the CDFs $F_y(\cdot)$ and $F_x(\cdot)$ of the input and output signals respectively, one can obtain the nonlinearity function in the transmitter and compensate for it.

It is well established that, for example, most of the OFDM based signals follow a Rayleigh distribution, a generalized Rician distribution, or Weibull distribution. In the following, the theoretical analysis for the Rayleigh, Rician and Weibull distributions are given as an example of application of the CDF based compensation techniques to signals having these distributions. As will be appreciated other distribution may be used.

The Rayleigh distribution is given by:

$$f(r \mid b_R) = \frac{r}{b_R^2} \exp\left(\frac{-r^2}{2b_R^2}\right) \qquad (5)$$

in which $b_R$ is the scale parameter of the distribution, The Rician distribution is given by:

$$f(r \mid a_I, b_I) = \frac{r}{b_I^2} \exp\left(\frac{-(r^2 + a_I^2)}{2b_I^2}\right) \cdot I_o\left(\frac{r \cdot a_I}{b_I^2}\right) \qquad (6)$$

where $a_I$ accordingly is an indication of the distance between the reference point and the center of the bivariate distribution and $b_I$ is the scale parameter, and $I_o(\cdot)$ denotes a Bessel function of the first kind.

The Weibull distribution is given by:

$$f(r \mid b_W, c_W) = \frac{c_W}{b_W}\left(\frac{r}{b_W}\right)^{c_W - 1} \exp\left(-\left(\frac{r}{b_W}\right)^{c_W}\right) \; r \geq 0, b_W > 0, c_W > 0 \qquad (7)$$

where $c_W$ is the shape and $b_W$ is the scale parameters of the Weibull distribution.

Below are described example embodiments of the present disclosure which show mitigation of the nonlinearity in a transmitter using the CDF of the signal received at the receiver. The nonlinearity is expressed as functions of the CDF are described for the cases of Rayleigh and Weibull distributions. In these cases, the amplitude nonlinearity can be estimated using the following formulas:

$$F_1^{-1}(r_y) = \sqrt{-2b_R^2 \ln(1 - F_y(r_y))} \qquad (8)$$

$$F_1^{-1}(r_y) = b_W\left(-\ln(1 - F_y(r_y))^{\frac{1}{c_W}}\right) \qquad (9)$$

Figure 4:
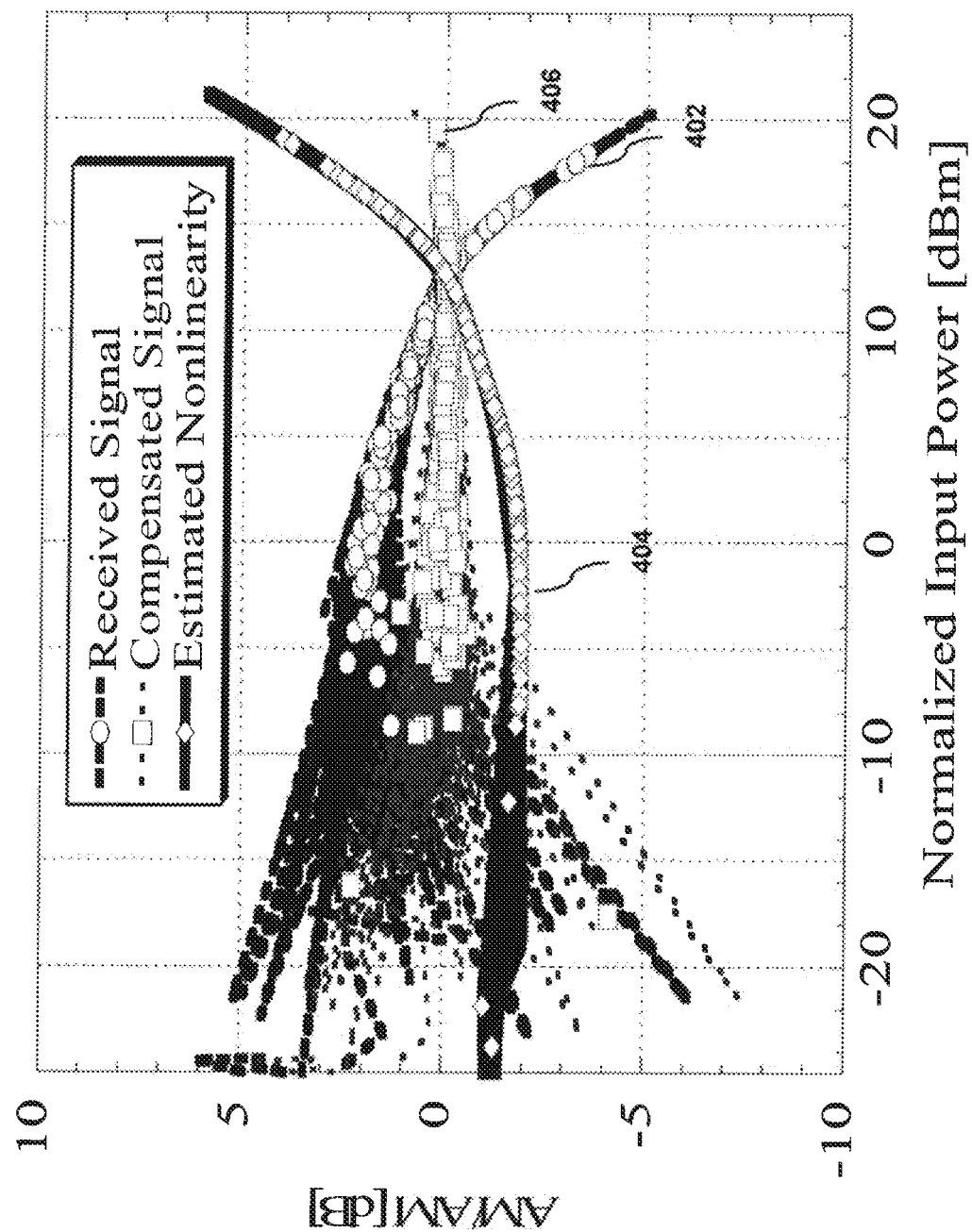
FIG. 4 shows an AM/AM of an estimated nonlinearity and of a linearized system according to an embodiment of the present matter.

Example plots in a graph of normalized input power versus AM/AM for results of the estimation of the nonlinearity using CDF and the linearized system AM/AM behaviors according to embodiments of the present disclosure are shown in FIG. 4. A received signal plot 402 (shown with circular symbols), an estimated nonlinearity 404 (shown with diamond symbols) and the compensated signal 406 (shown with square symbols) are shown in FIG. 4. As may be seen from the figure the CDF based nonlinearity compensation method of the subject disclosure reasonably estimates the nonlinearity and compensates for it.

Figure 5:
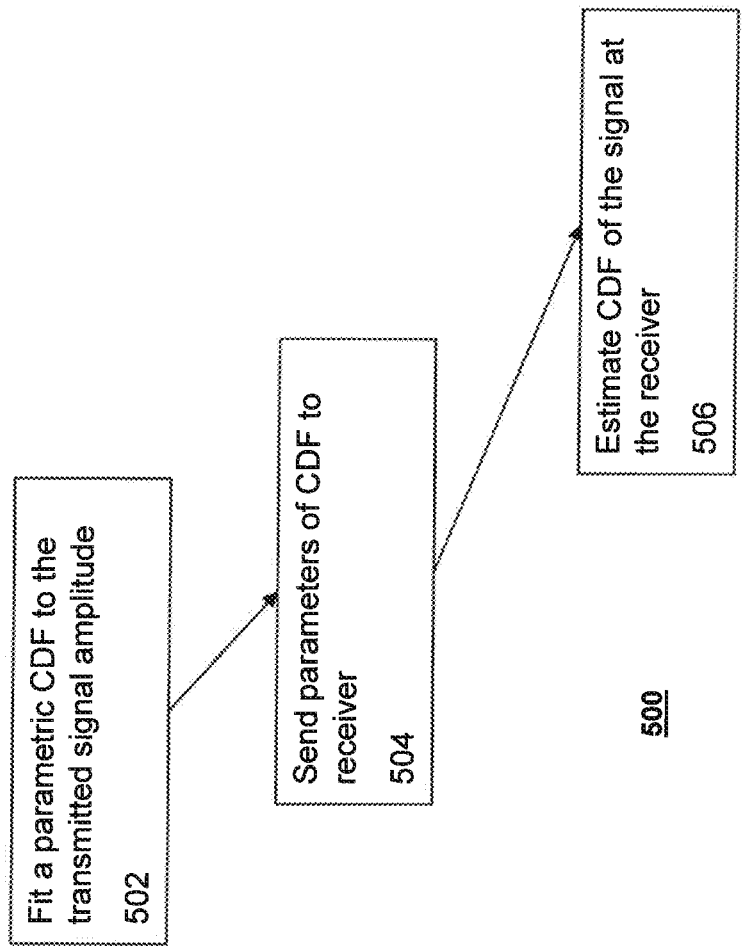
FIG. 5 shows a block diagram of one estimation method, according to an embodiment of the present matter.

A flow chart 500 for estimating and mitigating transmitter nonlinearity according to an embodiment of the present disclosure is shown FIG. 5. A first step in estimating the AM/AM is to fit a parametric CDF to the transmitted signal amplitude, as shown in block 502. A maximum likelihood estimation (MLE) of the parameters can be obtained through simple averaging of proper statistics. For instance in the case of Weibull distribution, the parameters can be estimated using the following equations. If it is assumed that $r_1, \ldots, r_N$ are the samples of the transmitted frame and $R_i = \ln(r_i)$, then the MLE estimated values, $\hat{c}_W$ and $\hat{b}_W$, for the Weibull parameters can be obtained as below:

$$\hat{c}_W = \left( \frac{\sum_{i=1}^{N} r_i^{\hat{c}_W} R_i}{\sum_{i=1}^{N} r_i^{\hat{c}_W}} - \bar{R} \right)^{-1} \quad (10)$$

$$\hat{b}_W = \left( \frac{1}{N} \sum_{i=1}^{N} r_i^{\hat{c}_W} \right)^{\frac{1}{\hat{c}_W}} \quad (11)$$

where $\bar{R}$ denotes the average value of $R_i$.

At block 504 the parameters of the CDF are sent to the receiver. This may be done in many different ways know in the art. For example using a different channel. At block 506 the next step in estimating the AM/AM at the receiver is to estimate the CDF of the received signal. Since, the PA nonlinearity is not known at the receiver side, parametric CDF estimation may be unreasonable. As a result, empirical methods may be employed to obtain the CDF. Among empirical CDF estimation techniques, Kaplan-Meier is an example of a technique that has been found to be simple and accurate. In this approach the survival function of a random variable r with a CDF F(r) is estimated as:

$$P(r) = 1 - F(r) \quad (12)$$

To estimate the survival function, the scale is divided to N intervals namely: $[0 \ r_1], \ldots, [r_{N-1} \ r_N]$. Then P(r) can be estimated as below:

$$P(r) = \prod_{r_i < r} \left( \frac{n_i - d_i}{n_i} \right) \quad (13)$$

where $n_i$ is the number of samples greater than $r_{i-1}$ and $d_i$ represents the number of observations that are greater than $r_{i-1}$ but smaller than $r_i$.

As may be seen with the present method, phase distortion can be compensated at the transmitter without deteriorating the efficiency, since, the PAPR will not change and there is no need for a power back-off. Another advantage of the subject method is that, in general, the phase nonlinearity is less sensitive to the PAPR of the signal. The phase DPD can likely be implemented independently from the signal distribution and PAPR without being adaptive.

An example of implementing phase nonlinearity compensation at the transmitter side uses a simple LUT, which can be estimated using a high PAPR signal and then reused for other standards and with any PAPR.

Measurement results for different linearization techniques, i.e. DPD, PBO and distributed distortion compensation, are described which compares the performance of the present disclosure to conventional techniques. The comparison is carried out in terms of Power Efficiency (PE), Error Vector Magnitude (EVM), Normalized Mean Square Error (NMSE) and Adjacent Channel Power Ratio (ACPR).

Figure 6:
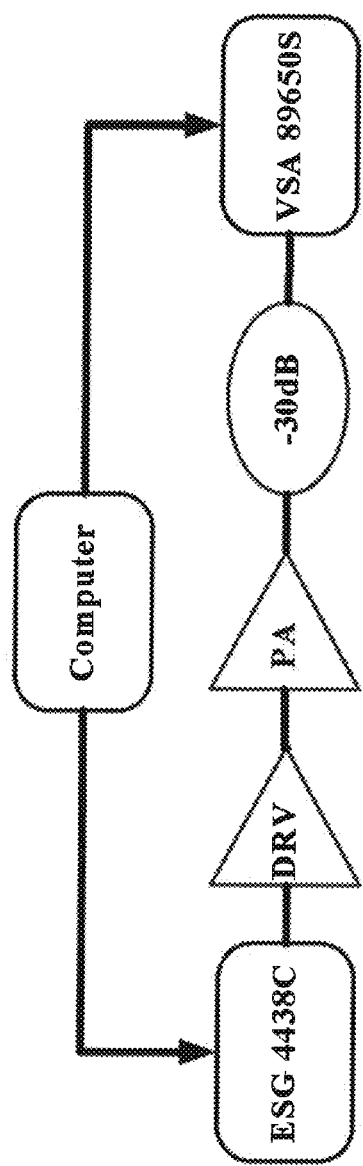
FIG. 6 shows a block diagram of a measurement setup according to an embodiment of the present matter.

A measurement setup may consist of a vector signal generator, a driver amplifier, a PA, an attenuator and a vector signal analyzer (VSA), is shown in FIG. 6.

Six different excitation signals are uploaded to the signal generator using a general-purpose interface bus (GPIB). The specifications of these excitation signals for system identification and evaluation are summarized in Table I.

Two different device-under-tests (DUTs), each composed of a class-AB PA suitable for mobile stations, where used in the measurement.

TABLE I

Parameters of the modulated signals

| Signal Number | Standard | PAPR (dB) | Bandwidth (MHz) | Sampling Frequency (MHz) |
|---|---|---|---|---|
| 1 | WiMAX | 10.2 | 5 | 92.16 |
| 2 | WiMAX | 12.7 | 5 | 92.16 |
| 3 | LTE | 10.4 | 5 | 61.44 |
| 4 | LTE | 12.4 | 5 | 61.44 |
| 5 | WCDMA | 9 | 3.84 | 92.16 |
| 6 | WCDMA | 10.9 | 3.84 | 92.16 |

In a first scenario, the channels were assumed to be ideal. The performance of the proposed distributed distortion compensation technique in terms of power efficiency and linearity is compared to the PBO and MP-DPD techniques in example of practical scenarios for uplink transmissions using two different wireless communication standards: WiMAX and LTE. These standards are provided as non-restrictive examples of application.

The measurement results for all the three above mentioned approaches are listed in Tables II and III. As is evident from the tables, MP-DPD has the highest PAPR before PA. As discussed before, an increase in the PAPR before PA causes an increase in the amount of back-off needed for driving the PA which in turn limits the improvement in efficiency.

TABLE II

Measurement results for WiMAX

| Method WiMAX | PAPR (dB) | PAPR before PA(dB) | ACPR1 (dBc)L,H | ACPR2 (dBc)L,H | EVM (%) | Eff. (%) |
|---|---|---|---|---|---|---|
| No Compensation | 11.4 | 11.4 | -37.7 -38.2 | -57.1 -57.6 | 3.4 | 10.8 |
| DPD | 11.4 | 15.4 | -46.5 -46.9 | -56.9 -57.3 | 0.8 | 4.4 |
| BO@3dB | 11.4 | 11.4 | -45.1 -45.6 | -60 -60.2 | 1.3 | 5.6 |
| PC | 11.4 | 11.4 | -38.7 -39.1 | -57.5 -58.2 | 1.2 | 10.8 |

TABLE III

Measurement results for LTE

| Method LTE | PAPR (dB) | PAPR before PA(dB) | ACPR1 (dBc)L,H | ACPR2 (dBc)L,H | EVM (%) | Eff. (%) |
|---|---|---|---|---|---|---|
| No Compensation | 7.8 | 7.8 | -30<br>-30.5 | -44<br>-44.5 | 5.9 | 23.4 |
| DPD | 7.8 | 11.4 | -42.5<br>-43.3 | -51.5<br>-51.7 | 0.6 | 11 |
| BO@2.5dB | 7.8 | 7.8 | -37.1<br>-37.8 | -50.7<br>-51.1 | 1.7 | 14 |
| PC@1dB BO | 7.8 | 7.8 | -33.8<br>-34.4 | -48.9<br>-49.5 | 1.7 | 19.2 |

Figure 7:
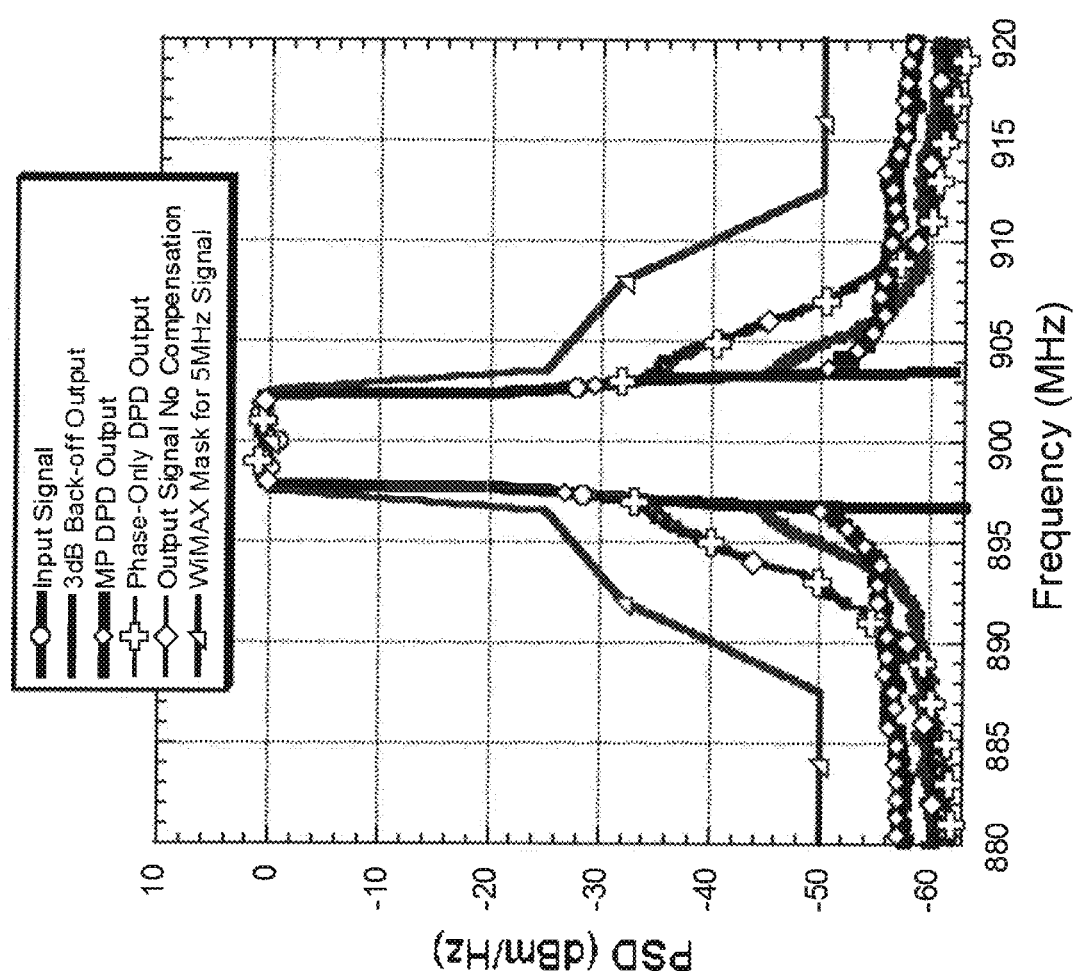
FIG. 7 shows a spectrum emission mask of the WiMAX standard applied to an embodiment of the present matter.
Figure 8:
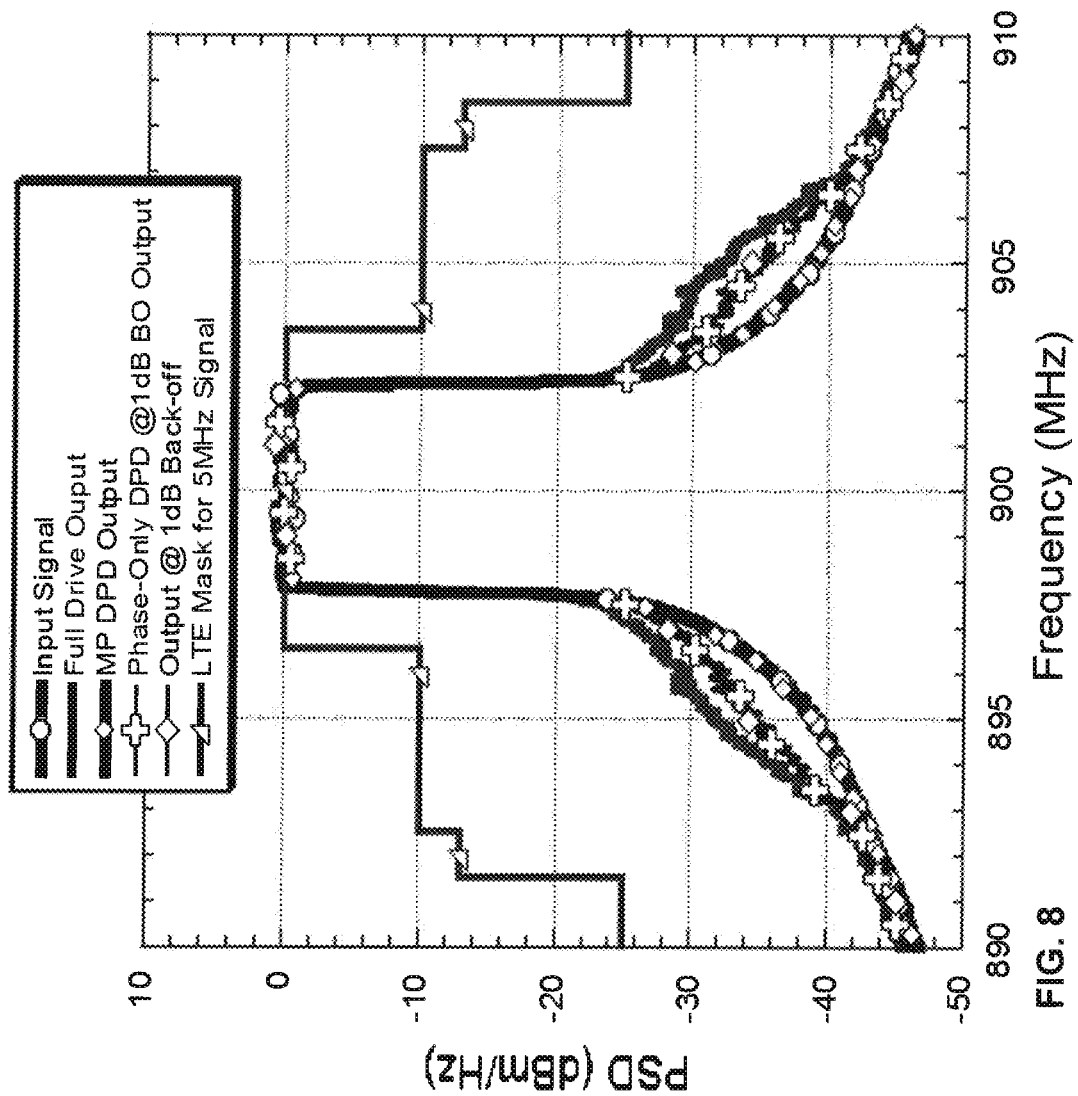
FIG. 8 shows a spectrum emission mask of the LTE standard applied to an embodiment of the present matter.

Concerning the spectral emission and ACPR requirements, all the methods could satisfy the ACPR requirements. FIGS. 7 and 8 show the spectrum emission masks of the WiMAX and LTE standards respectively along with the spectrums of input signal, phase-only DPD, PBO, fully driven PA output, MP-DPD.

In the second scenario, the effect of an additive white Gaussian noise channel is considered. The performance of the present invention is compared to DPD and back-off methods in terms of BER variation as a function of Signal to Noise Ratio (SNR).

Figure 9:
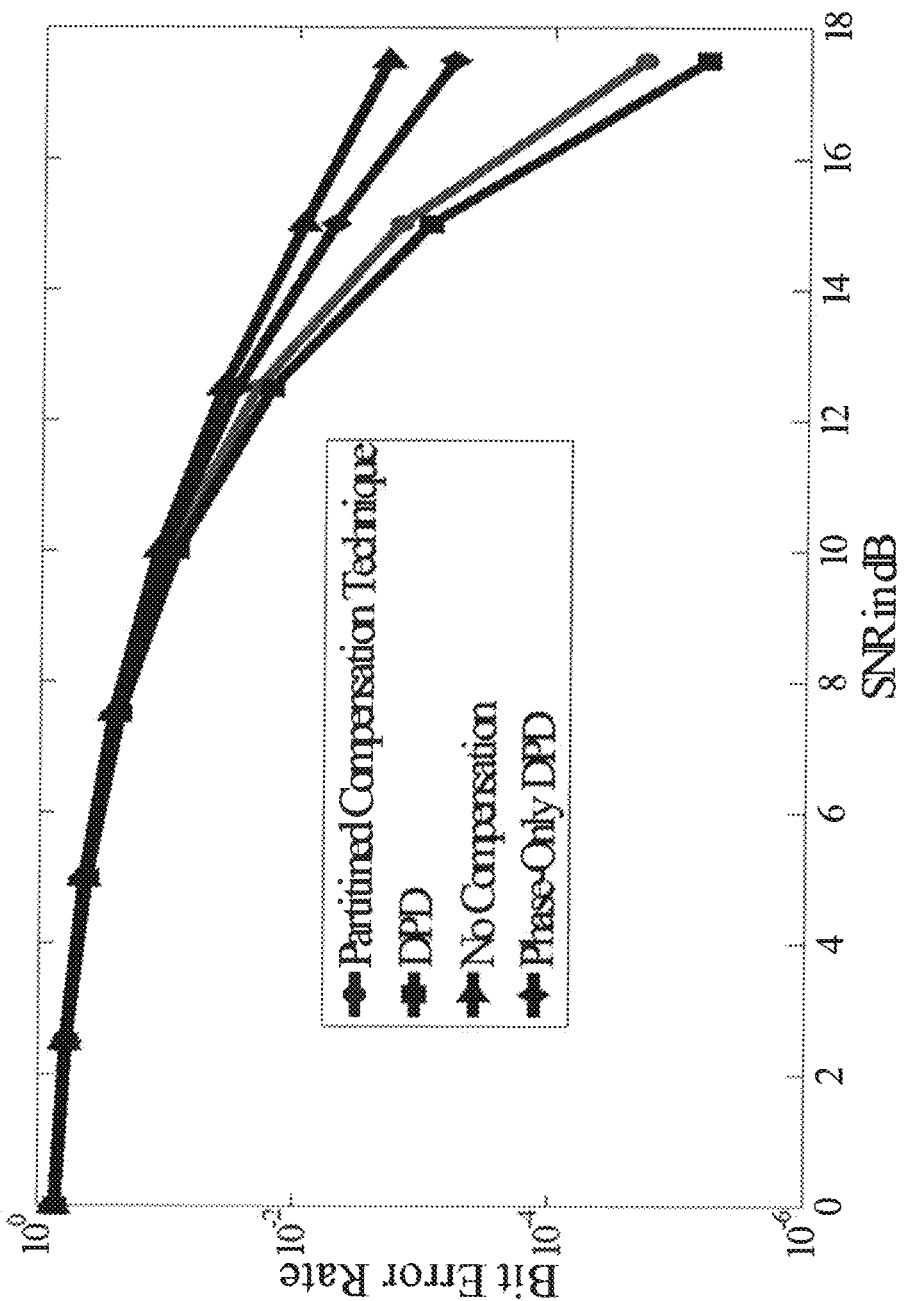
FIG. 9 shows a receiver BER results versus SNR according to an embodiment of the present matter.
Figure 10:
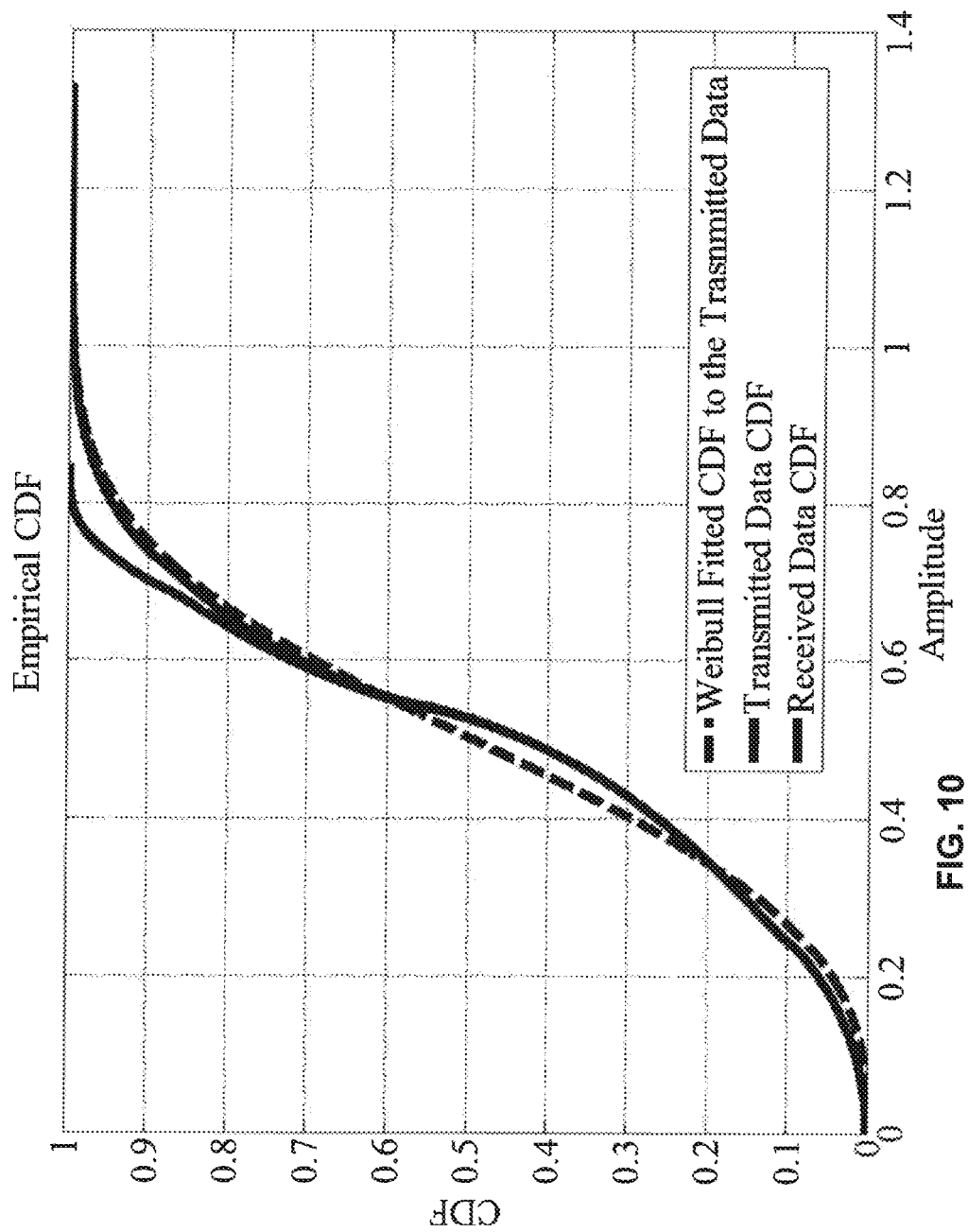
FIG. 10 shows a CDF of a transmitted and received signals with a Weibull fitted CDF to the transmitted signal according to an embodiment of the present matter.

FIG. 9 shows the receiver BER results versus SNR. As is shown in FIG. 9, the proposed technique could reasonably reduce the BER as the SNR increases to reach similar performance compared to the DPD technique. FIG. 10 shows a CDF of a transmitted and received signals with a Weibull fitted CDF to the transmitted signal.

In this disclosure, a method and an architecture for PA distortion compensation is described which may be applied to both uplink and downlink applications. According to embodiments of the present matter distortion compensation is partitioned between the transmitter and the receiver, where the transmitter may include a LUT-based phase-only predistortion and the receiver comprises a CDF-based amplitude nonlinearity estimation and post-compensation. The amplitude nonlinearity is compensated at the receiver after channel equalization and does not require any training sequence. It only requires no more than two parameters for the signal distribution for most of the wireless signals to be known by the receiver. The distributed distortion compensation technique replaces the conventional back-off approach or the full DPD approach. The example implementation results described herein show that the distributed distortion compensation according to the present matter provides almost the same linearity and reasonable BER performance as conventional techniques, but with considerable improvement in power efficiency.

Figure 11:
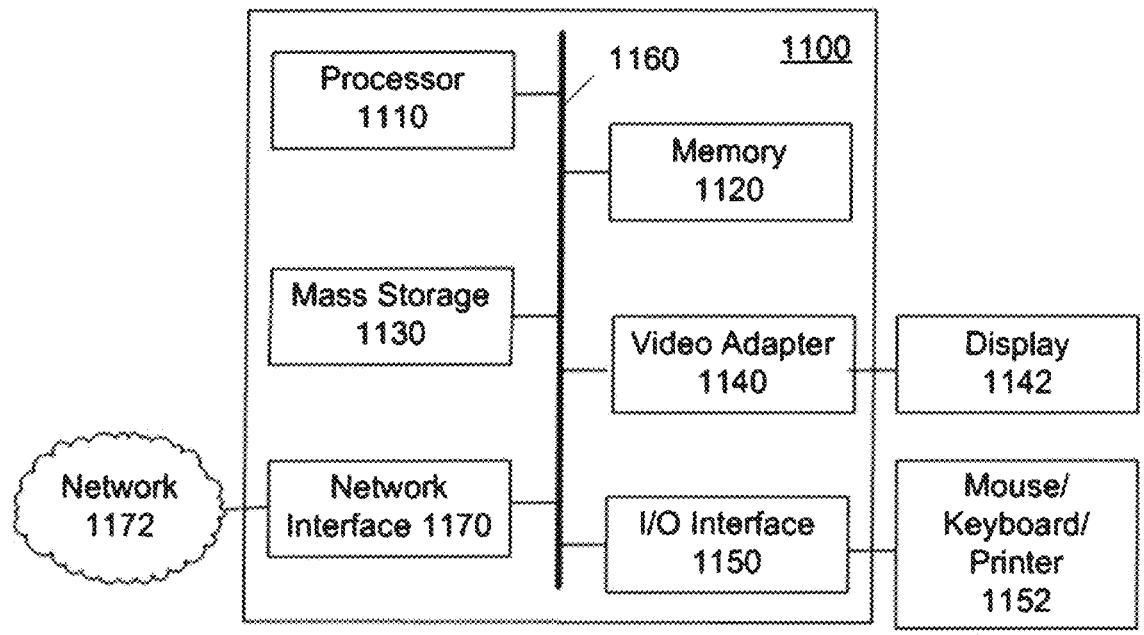
FIG. 11 is a block diagram of an embodiment of a processing system.

The methods, devices and systems described herein may be used in or with any computing system or device including but not limited to user equipments, mobile devices, node Bs, base stations, network elements, transmission points, machines, chips, etc. For example FIG. 11 is a block diagram of a processing system 1100 that may be used with the methods and devices according to the present disclosure. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system 1100 may comprise a processing unit equipped with one or more input/output devices, such as a speaker, microphone, mouse, touchscreen, keypad, keyboard, printer, display, and the like. The processing system may include one or more of a processor 1110, memory 1120, a mass storage device 1130, a video adapter 1140, and an I/O interface 1150 connected to a bus 1160. In at least one embodiment, processor 1110 may be multi-core or a many-core processor, or any other processor having multiple execution units, for example for executing one or more methods according to the present disclosure.

The bus 1160 may be one or more of any type of several bus architectures including a memory bus or memory controller, a peripheral bus, video bus, or the like. The memory 1120 may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

The mass storage device 1130 may comprise any type of storage device configured to store data, programs, and other information and to make the data, programs, and other information accessible via the bus. The mass storage device 1630 may comprise, for example, one or more of a solid state drive, hard disk drive, a magnetic disk drive, an optical disk drive, or the like.

The video adapter 1140 and the I/O interface 1150 provide interfaces to couple external input and output devices to the processing system. As illustrated, examples of input and output devices include the display 1142 coupled to the video adapter and the mouse/keyboard/printer 1152 coupled to the I/O interface. Other devices may be coupled to the processing system, and additional or fewer interface cards may be utilized. For example, a serial interface such as Universal Serial Bus (USB) (not shown) may be used to provide an interface for a printer.

The processing system 1100 also includes one or more network interfaces 1170, which may comprise wired links, such as an Ethernet cable or the like, and/or wireless links to access nodes or different networks. The network interface 1170 may allow the processing system to communicate with remote units or systems via the networks. For example, the network interface 1170 may provide wireless communication via one or more transmitters/transmit antennas and one or more receivers/receive antennas. In an embodiment, the processing system 1100 may be coupled to a local-area network or a wide-area network, shown as network 1172, for data processing and communications with remote devices, such as other processing systems, the Internet, remote storage facilities, or the like.

Figure 12:
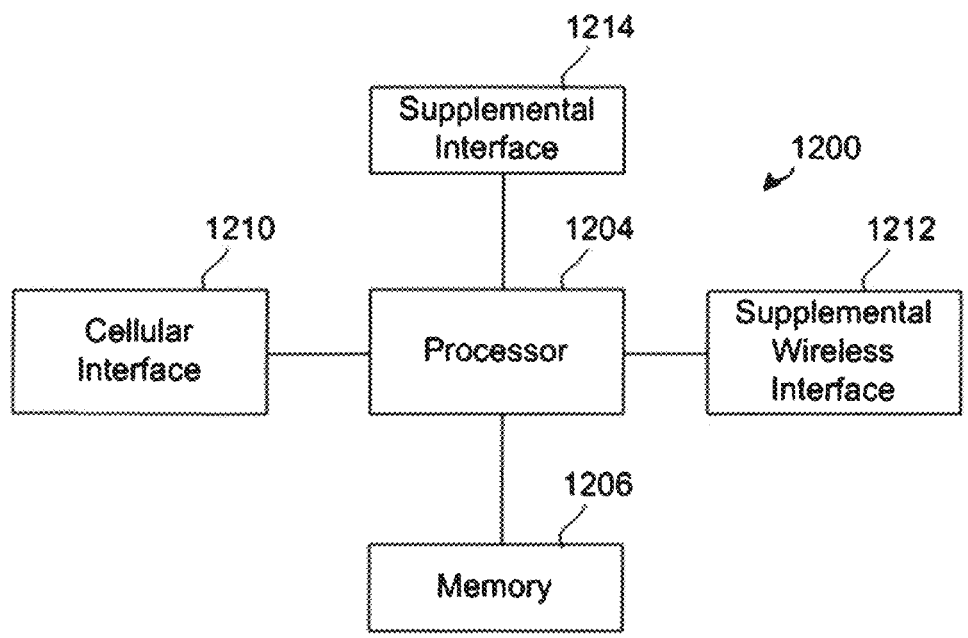
FIG. 12 is a block diagram of an embodiment of a communications device.

FIG. 12 illustrates a block diagram of an embodiment of a communications device or system 1200, which may be equivalent to one or more devices (e.g., user equipments, node Bs, base stations, network elements, transmission points, machines, chips, etc.) discussed above. The communications device 1200 may include one or more processors 1204, such as for example a multi-core or a many-core processor. Communications device 1200 may further include a memory 1206, a cellular interface 1210, a supplemental wireless interface 1212, and a supplemental interface 1214, which may (or may not) be arranged as shown in FIG. 12. The processor 1204 may be any component capable of performing computations and/or other processing related tasks, and the memory 1206 may be any component capable of storing programming and/or instructions for the processor 1204. The cellular interface 1210 may be any component or collection of components that allows the communications device 1200 to communicate using a cellular signal, and may be used to receive and/or transmit information over a cellular connection of a cellular network. The supplemental wireless interface 1212 may be any component or collection of components that allows the communications device 1200 to communicate via a non-cellular wireless protocol, such as a Wi-Fi or Bluetooth protocol, or a control protocol. The device 1200 may use the cellular interface 1210 and/or the supplemental wireless interface 1212 to communicate with any wirelessly enabled component, e.g., a base station, relay, mobile device, etc. The supplemental interface 1214 may be any component or collection of components that allows the communications device 1200 to communicate via a supplemental protocol, including wire-line protocols. In embodiments, the supplemental interface 1214 may allow the device 1200 to communicate with another component, such as a backhaul network component or a fronthaul network component.

Through the descriptions of the preceding embodiments, the teachings of the present disclosure may be implemented by using hardware only or by using a combination of software and hardware. Software or other computer executable instructions for implementing one or more embodiments, or one or more portions thereof, may be stored on any suitable computer readable storage medium. The computer readable storage medium may be a tangible or in transitory/non-transitory medium such as optical (e.g., CD, DVD, Blu-Ray, etc.), magnetic, hard disk, volatile or non-volatile, solid state, or any other type of storage medium known in the art.

We claim:

1. A method for distortion compensation in a communication link comprising:
   obtaining statistical information of a transmitted signal from one or more transmitters;
   receiving the transmitted signal at one or more receivers;
   obtaining statistical information of a received signal at one or more receivers;
   comparing statistical information of the received signal to the statistical information of the transmitted signal prior to transmission; and
   using results of the comparison, at one or more receivers, to post-compensate for non-linear distortions in the communication link.

2. A network element in a communication link comprising:
   an antenna;
   a receiver coupled to the antenna for receiving transmissions from a transmitter over a wireless channel, wherein the receiver is configured to:
      obtain statistical information of transmitted signals from one or more transmitters;
      obtain statistical information of a received signal at one or more receivers;
      compare statistical information of the received signal to the statistical information of the transmitted signal prior to transmission by the transmitter; and
      using results of the comparison, at one or more receivers, to post-compensate for non-linear distortions in the communication link.

3. The network element in claim 2, wherein the communication link is an uplink.

4. The network element in claim 3, wherein the transmitter is a mobile station comprising a signal generation, an RF front-end connected to one or more transmitting antennas.

5. The network element in claim 2, wherein the communication link is a downlink.

6. The network element in claim 5, wherein the receiver is a mobile station comprising one or more receiver antennas for receiving the transmitted signal.

7. The network elements of claim 2, wherein communication link in implemented in the front-haul of the communication network.

8. The network elements of claim 2, wherein communication link in implemented in the back-haul of the communication network.

* * * * *